United States Patent [19]

Adler

[11] 4,039,901

[45] Aug. 2, 1977

[54] ENCAPSULATED PLURAL ELECTRICAL COMPONENT ASSEMBLY FOR USE IN TRANSMITTERS AND THE LIKE

[75] Inventor: Alan J. Adler, Palo Alto, Calif.

[73] Assignee: Acurex Corporation, Mountain View, Calif.

[21] Appl. No.: 571,616

[22] Filed: Apr. 25, 1975

[51] Int. Cl.² .......................... H02B 1/00; H05K 5/00
[52] U.S. Cl. ................................. 361/422; 174/52 PE
[58] Field of Search .............. 174/52 R, 52 PE, 52 S, 174/52 FP; 317/99, 101 R, 101 B–101 DH, 120; 325/352–357

[56] References Cited

U.S. PATENT DOCUMENTS

| | | | |
|---|---|---|---|
| 2,963,577 | 12/1960 | Errichiello et al. | 325/355 |
| 3,721,746 | 3/1973 | Knappenberger | 317/101 R X |
| 3,771,024 | 11/1973 | Dumas | 174/52 PE X |

Primary Examiner—James R. Scott
Attorney, Agent, or Firm—Flehr, Hohbach, Test, Albritton & Herbert

[57] ABSTRACT

Transmitter for conveying information from a rotating member to a stationary monitor utilizing hybrid circuits and discrete components mounted in a rigid housing and interconnected by feedthrough capacitors and pins affixed to the housing. Additional feedthrough connectors are provided for connecting the transmitter to a power supply and extremely located sensing elements. The hybrid circuits are connected directly to the feedthrough elements without intermediate packaging or leads, and the outer contour of the housing is made to conform to the side wall of a bore in which the transmitter is mounted in the rotating member.

15 Claims, 7 Drawing Figures

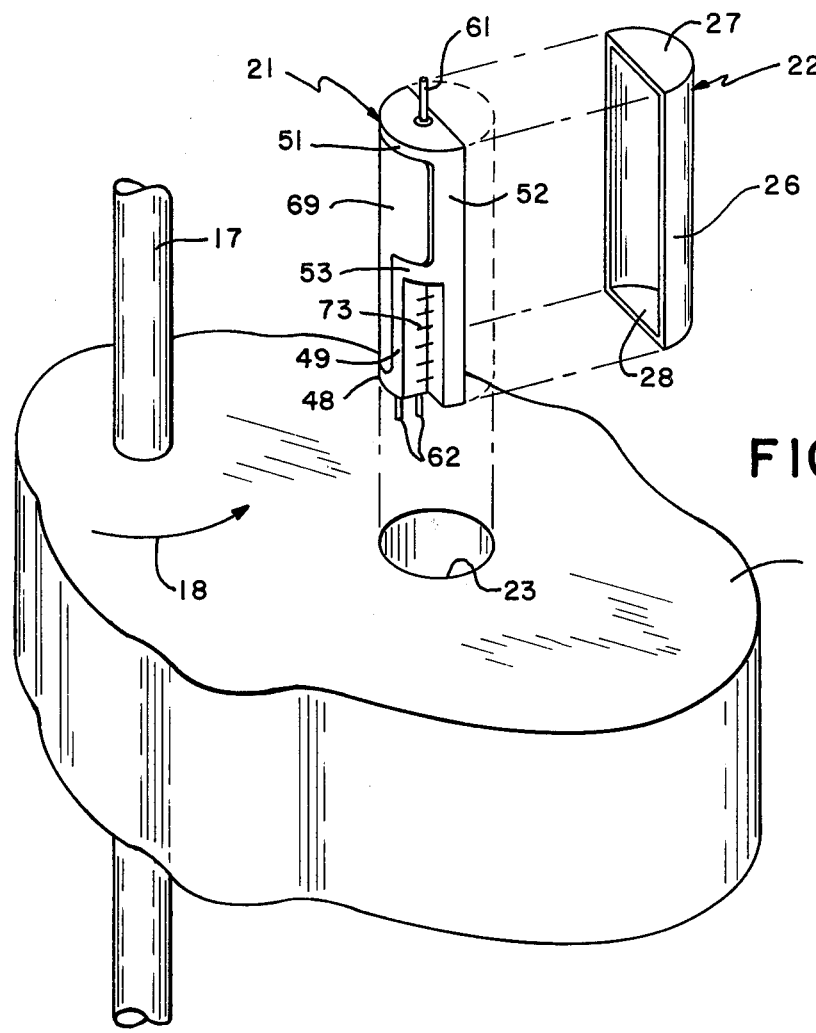
FIG.—1
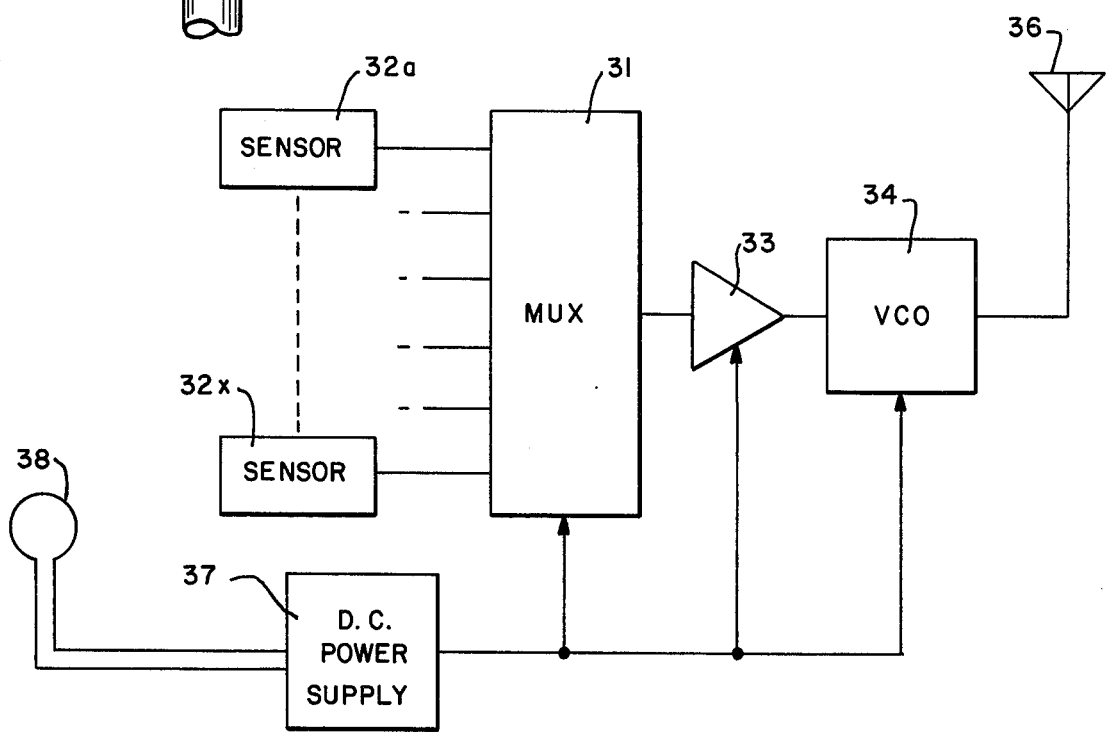
FIG.—2

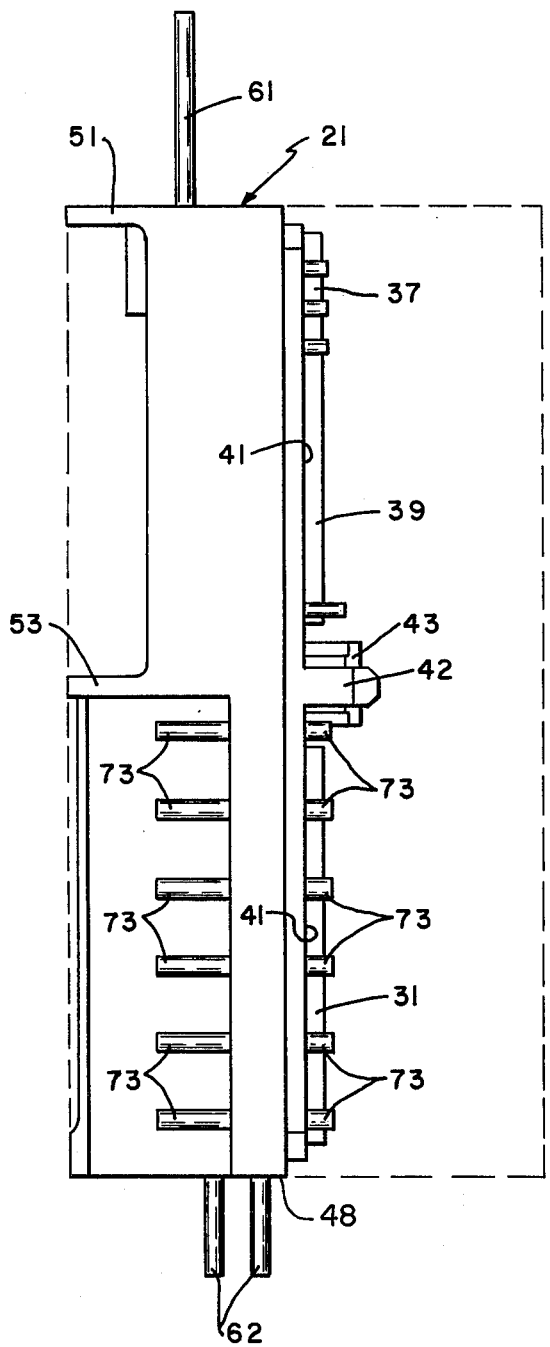
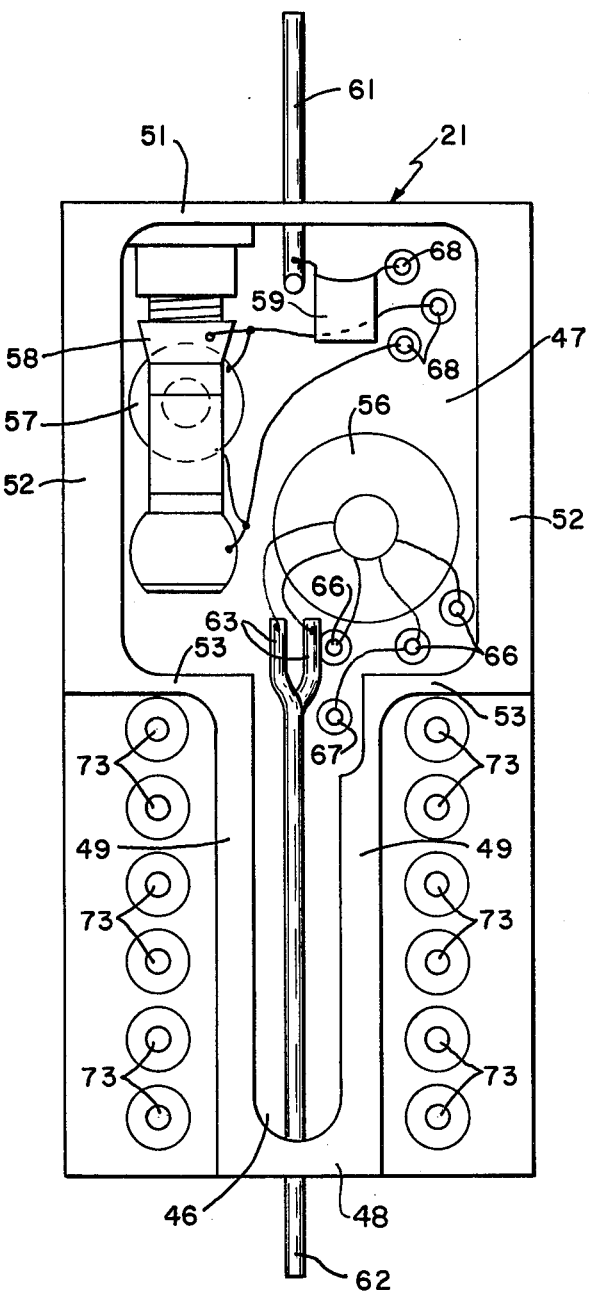
FIG.—3  FIG.—4

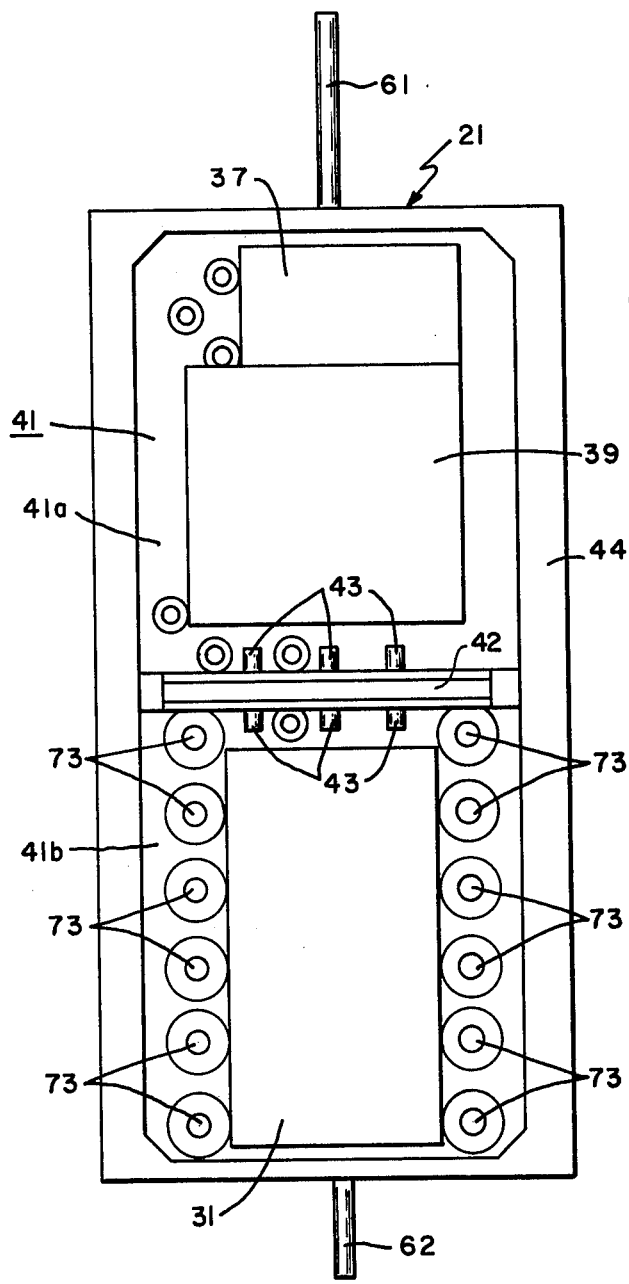
FIG.—5
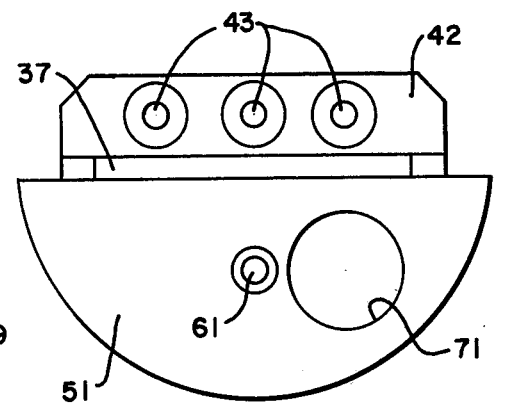
FIG.—6
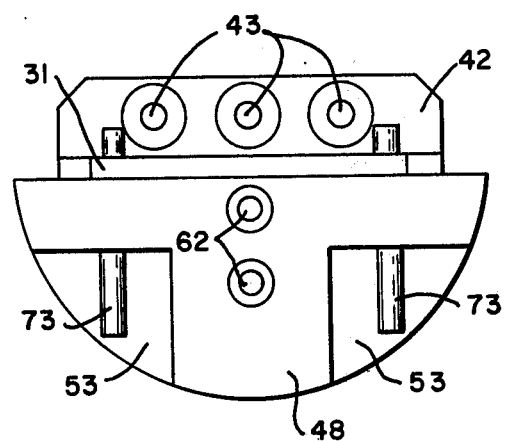
FIG.—7

ENCAPSULATED PLURAL ELECTRICAL COMPONENT ASSEMBLY FOR USE IN TRANSMITTERS AND THE LIKE

BACKGROUND OF THE INVENTION

This invention pertains generally to electrical measuring apparatus and more particularly to a transmitter for conveying information from a rotating member to a stationary monitor.

Heretofore, there have been some attempts to monitor conditions and make measurements on rotating members by means of sensing elements and transmitters mounted on the members for conveying information to suitable monitoring and processing equipment located remotely of the members. Examples of such measurements include temperature and stress measurements in jet engines and other turbines, stress measurements in gears, and voltage and current measurements in generators and other rotating electrical machines.

In many such measurements, the transmitters are subjected to severe environments. For example, when mounted on the rotor of a jet engine, a transmitter is typically exposed to a centrifugal force on the order of 30,000 G's. In order to withstand such forces, a transmitter must be very strong mechanically, and at the same time it must be small enough to avoid interfering with the normal operation of the machine in which it is installed.

Transmitters heretofore provided for use in such measurements have utilized a combination of hybrid circuits and discrete components encased in a body of potting material with pins for connection to external components such as sensing elements and a power supply. The hybrid circuits comprise a ceramic substrate on which circuit components are mounted in integrated form, and the hybrid circuit is generally mounted in a package having leads connected to the components on the substrate. In prior art transmitters, the leads are utilized in making connections between the hybrid circuits and the discrete components and connecting pins. Although suitable for some applications, transmitters constructed in this manner are too large for other applications and not strong enough for severe environments such as jet engines.

SUMMARY AND OBJECTS OF THE INVENTION

The invention provides a transmitter having an integral housing in which the circuit elements of the transmitter provide a rugged structure suitable for use in jet engines and other extreme environments. The transmitter utilizes hybrid circuits and discrete components mounted in a rigid housing and interconnected by feedthrough capacitors and pins affixed to the housing. Additional feedthrough connectors are provided for connecting the transmitter to a power supply and externally located sensing elements. The hybrid circuits are connected directly to the feedthrough elements without the intermediate packaging and leads of the prior art, and the outer contour of the housing is made to conform to the side wall of a bore in which the transmitter is mounted in the rotating member.

It is in general an object of the invention to provide a new and improved transmitter for conveying information from a rotating member to a stationary monitor.

Another object of the invention is to provide a transmitter of the above character having a rugged housing forming an integral part thereof.

Additional objects and features of the invention will be apparent from the following description in which the preferred embodiment is set forth in detail in conjunction with the accompanying drawings.

BRIEF DESCRIPTION OF THE DRAWINGS

FIG. 1 is an exploded perspective view illustrating one embodiment of a transmitter according to the invention in conjunction with a rotating member.

FIG. 2 is a block diagram of the circuit of the transmitter of FIG. 1.

FIG. 3 is a side elevational view of the transmitter of FIG. 1, with the cover removed for clarity of illustration.

FIGS. 4 and 5 are additional side elevational views of the transmitter of FIG. 1, taken 90° from the view of FIG. 3, again with the cover removed for clarity of illustration.

FIGS. 6 and 7 are end views of the transmitter of FIG. 1, with the cover removed for clarity of illustration.

DESCRIPTION OF THE PREFERRED EMBODIMENT

In FIG. 1, the invention is shown in conjunction with a rotor 16 which, for purposes of illustration, is shown affixed to a shaft 17 and adapted for rotation about the axis of the shaft in the direction indicated by arrow 18. It is to be understood, however, that the rotor can be any rotating member on which measurements are to be made, such as a blade of a turbine, and that the member can be mounted for rotation in any suitable manner.

The transmitter includes a generally cylindrical housing comprising a base 21 and a cover 22 adapted to be mounted in a circular bore 23 in rotor 16. The bore is displaced from the axis of rotation and extends in a direction generally parallel to the axis. Base 21 is described in detail hereinafter, and cover 22 comprises a generally semicylindrical side wall 26 and generally semicircular end walls 27, 28.

Electrically, as indicated in FIG. 2, the transmitter comprises a scanner or multiplexer 31 which receives inputs from a plurality of sensing elements 32a–32x. The sensing elements are generally mounted on the rotor away from the transmitter and connected to the transmitter in a manner described hereinafter. The sensors can be any suitable elements for providing electrical signals corresponding to measurements to be made on the rotor, and in one embodiment six thermocouples are mounted on turbine blades to monitor the temperature of the blades. The number and type of sensing elements can be selected as desired, and if only one element is used, multiplexer 31 can be omitted, in which case the sensing element would be connected directly to the next stage of the transmitter.

Multiplexer 31 is of known design, and it scans the output signals from sensors 32a–32x and applies these signals sequentially to the input of an amplifier 33. The output of the amplifier is connected to the control input of a voltage controlled oscillator, and the output of the oscillator varies in frequency with the level of the signals from the sensing elements. The output of oscillator 34 is connected to an antenna 36 mounted on the rotor in proximity to a stationary receiving antenna. In one preferred embodiment, the antenna comprises a coil disposed coaxially of the axis of rotation.

Operating power for the transmitter is provided by a DC power supply 37 which receives input power through a pick-up loop 38 which is mounted on the rotor in proximity to a stationary loop (not shown) which is energized with current having a frequency on the order of 160 KHz. The power supply converts the 160 KHz current to direct current of suitable voltage, such as 1-10 volts.

In the preferred embodiment, multiplexer 31, amplifier 33, voltage controlled oscillator 34, and power supply 37 are constructed in the form of hybrid circuits, with amplifier 33 and oscillator 34 being combined in a single such circuit designated by the reference numeral 39.

Base 21 is generally semicylindrical, and it has an axially elongated generally planar substrate mounting surface on one side thereof. A laterally extending rib 42 protrudes from the mounting surface and divides the surface into an upper section 41a and a lower section 41b. The power supply and amplifier/oscillator hybrid circuits 37, 39 are mounted on the upper section, and the multiplexer hybrid circuit 31 is mounted on the lower section of the mounting surface. Rib 42 serves as a shield between the two sections, and the circuits in the two sections are interconnected by feedthrough capacitors 43 mounted in rib 42.

When mounted on base 21, cover 22 encloses the hybrid circuits and engages a sealing surface 44 adjacent to the periphery of mounting surface 41. The cover is affixed to the base by suitable means such as welding.

On the side opposite mounting surface 41, base 21 is formed to include an axially extending channel 46 toward one end thereof and a discrete component cavity 47 toward the other end. Channel 46 is formed by an end wall 48 and a pair of axially extending ribs 49 spaced inwardly of the lateral margins of the base. Cavity 47 is defined by a generally semicircular outer end wall 51, side walls 52, and inner end walls 53 which extend between side walls 52 and ribs 49.

As best illustrated in FIG. 4, the discrete components mounted in cavity or compartment 47 include a power transformer 56, a tuning coil 57 and trimmer capacitor 58, and a coupling capacitor 59. Coil 57 and capacitor 58 are frequency determining components for oscillator 34, and capacitor 59 is connected between the output of the oscillator and an output pin 61 which extends axially from end wall 51 for connection to antenna 36. Additional electrical connecting pins 62 extend axially from end wall 48 for connection to power pick-up loop 38. Pins 62 are connected to the primary winding of transformer 56 by conductors 63 which extend through channel 46.

Connections between power transformer 56 and power supply circuit 37 are made by means of feedthrough pins 66 which are mounted in the base and extend between mounting surface 41 and compartment 47. A similar pin 67 extends between channel 46 and mounting surface 41 to provide a power connection to multiplex circuit 31. Additional feedthrough pins 68 extend between chamber 47 and surface 41 to interconnect coil 57, capacitors 58, 59 and the remainder of oscillator 34.

In the preferred embodiment, after the discrete components are mounted in compartment 47 and connected to their respective pins, channel 46 and compartment 47 are filled with a suitable potting compound such as epoxy resin. The potting compound hardens to form a rigid unitary body which is formed to have an outer contour corresponding generally to the cylindrical contour of the housing. An opening 71 is provided in end wall 51 to permit access to trimmer capacitor 58 for adjustment of the same.

Sensing elements 32a-33x are connected to multiplex circuit 31 by means of feedthrough capacitors 73 which are mounted in base 21 between ribs 49 and the lateral margins of the base. The hybrid circuits are connected directly to one end of the feedthrough capacitors in the region within cover 22, and the other ends of the feedthrough capacitors are accessible externally of the housing for connection to suitable leads from the sensing elements.

In the preferred embodiment, base 21 and cover 22 are fabricated of a rigid metal such as steel, and the surfaces of the base and cover are plated with an electrically conductive material such as gold. These parts are manufactured by a suitable process such as machining or casting.

Operation and use of the transmitter can be described briefly. It is assumed that sensing elements 32a-32x, antenna 36 and power pick-up loop 38 are mounted in suitable locations on rotor 16. Leads from the sensing elements are connected to feedthrough capacitors 73 externally of the housing, leads from the antenna and pick-up loop are connected to pins 61 and 62, and the transmitter is placed in bore 23. With the rotor turning and the transmitter energized, frequency modulated signals are transmitted from antenna 36 corresponding to the conditions sensed by the sensing elements.

The invention has a number of important features and advantages. The transmitter is compact and rugged, and therefore, particularly suitable for use in extreme environments such as jet engines. The hybrid circuits are connected directly to the feedthrough pins and capacitors, with no intermediate leads as required by the prior art. In the embodiment illustrated, both the cover and the base of the housing are semicylindrical, and the assembly is mounted in a circular bore generally parallel to the axis of rotation. However, the housing and bore can have other contours, e.g. rectangular, and the assembly can be mounted otherwise than parallel to the axis of rotation. Likewise, the assembly can be mounted on moving members by any suitable means, and it is not necessarily mounted in a bore or other opening.

It is apparent from the foregoing that a new and improved integral transmitter and housing assembly has been provided. While only one preferred embodiment has been described, as will be apparent to those familiar with the art, certain changes and modifications can be made without departing from the scope of the invention as defined by the following claims.

What is claimed is:

1. In an electrical device: a rigid housing defining first and second cavities, a discrete component mounted in the first cavity, a hybrid circuit mounted in the second cavity, said hybrid circuit consisting of a substrate and a plurality of interconnected circuit elements mounted on the substrate, connector means mounted on the housing and extending between the cavities, said connector means being connected directly between the discrete component and the hybrid circuit, with no intermediate leads or additional packaging encasing the hybrid circuit, and additional connector means mounted on the housing and extending from one of the cavities to the exterior of the housing for connection to an element outside the housing.

2. The device of claim 1 wherein the cavities are separated by a portion of the housing and the first named connector means extend through said portion of the housing.

3. The device of claim 1 wherein the first named connector means and the additional connector means comprise feedthrough connectors.

4. The device of claim 1 wherein the assembly is adapted to be mounted in a bore in a moving member and the outer contour corresponds generally to the contour of the bore.

5. The device of claim 1 further including a body of potting material disposed in the discrete component cavity.

6. In a transmitter adapted to be mounted on a moving member for transmitting information from a sensing element to a receiver located remotely of the member: a rigid housing comprising an axially extending base with a substrate mounting surface on one side thereof, a plurality of electrical connectors extending through the base between the substrate mounting surface and a region outside the housing on the other side of the base, said connectors being adapted for connection to the sensing element in the region outside the housing, a hybrid circuit comprising a substrate and a plurality of circuit elements mounted on the mounting surface and connected directly to the connectors, with no additional leads or packaging for the hybrid circuit, and a cover mounted on the mounting surface side of the base and enclosing the hybrid circuit.

7. The transmitter of claim 6 wherein the base is formed to include a cavity for discrete components on the side opposite the mounting surface, together with additional connectors extending between the mounting surface and the cavity, a plurality of discrete components mounted in the cavity and connected therein to the additional connectors, and a potting compound filling the cavity to form a unitary structure.

8. The transmitter of claim 7 further including at least one additional hybrid circuit mounted on the mounting surface in an axially spaced relation to the first named hybrid circuit.

9. The transmitter of claim 8 further including a lateral rib extending from the mounting surface intermediate the hybrid circuits and electrical connectors extending through the rib and interconnecting the hybrid circuits.

10. The transmitter of claim 6 wherein the electrical connectors are feedthrough capacitors.

11. The transmitter of claim 6 wherein the moving member is a rotating member.

12. The transmitter of claim 6 wherein the housing is mounted in a bore in the moving member, and the outer contour of the housing corresponds generally to the contour of the bore.

13. In a transmitter adapted to be mounted on a moving member for transmitting information from a sensing element to a receiver located remotely of the member: a rigid housing mounted in a bore in the member, said housing comprising an axially elongated base having a generally planar substrate mounting surface on one side thereof and means on the other side defining an axially extending channel toward one end and a discrete component cavity toward the other end, the means defining the channel including a pair of axially extending ribs spaced inwardly of the lateral margins of the base, a plurality of feedthrough connectors extending through the base from the substrate mounting surface to the region outside the axially extending channel for connection in said region to the sensing element, a first hybrid circuit comprising a substrate and a plurality of interconnected circuit elements mounted on the substrate mounting surface toward the one end of the base and connected directly to the feedthrough connectors, a second hybrid circuit comprising a substrate and a plurality of interconnected circuit elements mounted on the mounting surface toward the other end of the base, a lateral rib extending from the mounting surface intermediate the hybrid circuits, feedthrough connectors extending through the lateral rib and interconnecting the hybrid circuits, a plurality of discrete components mounted in the cavity, additional feedthrough connectors extending through the base from the substrate mounting surface to the cavity and interconnecting the second hybrid circuit and the discrete components, a body of potting material disposed in the channel and cavity, and a cover mounted on the mounting surface side of the base and enclosing the hybrid circuits, the body of potting material and the cover having outer contours conforming generally to portions of the bore.

14. The transmitter of claim 13 further including electrical connecting pins extending axially from the one end of the base and electrical connectors extending through the channel interconnecting the pins and the discrete components.

15. The transmitter of claim 13 wherein the bore is circular and the outer contours of the body of potting material and the cover are generally semicylindrical.

* * * * *